United States Patent
Newnham et al.

(10) Patent No.: US 6,232,702 B1
(45) Date of Patent: May 15, 2001

(54) FLEXTENSIONAL METAL-CERAMIC COMPOSITE TRANSDUCER

(75) Inventors: Robert E. Newnham; Jindong Zhang, both of State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/376,259

(22) Filed: Aug. 18, 1999

Related U.S. Application Data

(60) Provisional application No. 60/096,964, filed on Aug. 18, 1998.

(51) Int. Cl.[7] .................................................. H01L 41/08
(52) U.S. Cl. ............................ 310/334; 310/324; 310/369
(58) Field of Search .................................... 310/324, 334, 310/364

(56) References Cited

U.S. PATENT DOCUMENTS

| | | |
|---|---|---|
| 2,403,692 | 7/1946 | Tibbetts . |
| 2,477,596 | * 8/1949 | Gravley ................................ 310/334 |
| 2,487,962 | * 11/1949 | Arndt, Jr. ............................. 310/334 |
| 2,607,858 | * 8/1952 | Mason ............................... 310/369 X |
| 2,895,062 | * 7/1959 | Abbott ................................ 310/334 |
| 4,685,767 | * 8/1987 | Ueshiba et al. ................. 310/369 X |
| 4,999,819 | 3/1991 | Newnham et al. . |
| 5,276,657 | 1/1994 | Newnham et al. . |
| 5,729,077 | 3/1998 | Newnham et al. . |

OTHER PUBLICATIONS

"History of the Flextensional Electroacoustic Transducer"; Kenneth D. Rolt; Published Oct. 26, 1989, J. Acoust. Soc. Am. 87 (3), Mar., 1990, pp. 1340–1349.

"Transducers, Underwater Acoustic", W. Jack Hughes, Encyclopedia of Applied Physics, vol. 22, pp. 67–84 1998.

"Innovative Approaches for Generating High Power, Low Frequency Sound", E.F. Rynne, Naval Command, Control & Ocean Surveillance Center, RDT&E Division, pp. 38–49 No Date.

"Piezoelectric Composites with High Sensitivity and High Capacitance for Use at High Pressures", Q.C. Xu et al., IEEE Transactions on Ultrasonics, Ferroelectrics, and Frequency Control, vol. 38, No. 6, Nov. 1991, pp. 634–638.

"Composite Piezoelectric Transducer With Truncated Conical Endcaps 'Cymbal'"; Aydin Dogan et al., IEEE Transactions on Ultrasoncics, Ferroelectrics, and Frequency Control, vol. 44, No. 3, May, 1997, pp. 597–605.

"A Low–frequency Directional Flextensional Transducer and Line Array", Stephen Butler, et al., J. Acoust. Soc. Am. 102(1), Jul. 1997, pp. 308–314.

* cited by examiner

Primary Examiner—Mark O. Budd
(74) Attorney, Agent, or Firm—Ohlandt, Greeley, Ruggiero & Perle, L.L.P.

(57) ABSTRACT

An electroactive device incorporating the invention includes an electroactive ceramic annular substrate having a pair of opposed planar annular surfaces, a hollowed interior region and a thickness aspect. A first cap having a concave shape that extends into the hollowed interior region includes a rim portion, bounding the hollowed interior region, and joined to a first one of the planar surfaces. A second cap having a concave shape that extends into the hollowed interior region includes a rim portion, bounding the hollowed interior region, and joined to a second one of the planar surfaces. A potential measured across the ceramic substrate enables a field change in the ceramic substrate to be sensed, the field change caused by flexure of the ceramic substrate as a result of a pressure applied to the first and second caps.

10 Claims, 4 Drawing Sheets

US 6,232,702 B1

FLEXTENSIONAL METAL-CERAMIC COMPOSITE TRANSDUCER

PRIORITY

This Application claims priority from U.S. Provisional Application Serial No. 60/096,964, filed Aug. 18, 1998. +gi

GOVERNMENT SUPPORT

This invention was made with Government support awarded by the U.S. Department of the Navy. The Government has certain rights in the invention.

FIELD OF THE INVENTION

This invention relates to electroactive ceramic transducers (piezoelectric, electrostrictive, etc.) and, more particularly, to a metal-ceramic electroactive actuator/sensor exhibiting large positional displacements.

BACKGROUND OF THE INVENTION

Flextensional transducers were first developed in the 1920s and have been used as underwater transducers since the 1950s. They consist of an active piezoelectric or magnetostrictive drive element and a mechanical shell structure. The shell is used as a mechanical transformer which transforms the high impedance, small extensional motion of the ceramic into low impedance, large flexural motion of the shell. According to the shape of the shell, flextensional transducers are divided into five classes. Flextensional transducers range in size from several centimeters to several meters in length and can weigh up to hundreds of kilograms. They are commonly used in the frequency range of 300 to 3000 Hz. Such transducers can operate at high hydrostatic pressures, and have wide bandwidths with high power output.

A new type of high performance flextensional transducer called the "moonie," was developed by an inventor hereof, and is shown in U.S. Pat. No. 4,999,819. The moonie acoustic transducer is of sandwich construction and is particularly useful for the transformation of hydrostatic pressures to electrical signals. A pair of metal plates are positioned to sandwich a piezoelectric element, with each plate having a cavity formed adjacent to the piezoelectric element. The plates are bonded to the piezoelectric element to provide a unitary structure. The cavities provide a stress-transforming capability which amplifies an incoming compressive stress and converts it to a radial extensional stress in the ceramic.

U.S. Pat. No. 5,276,657, assigned to the same assignee of this application, describes a ceramic actuator that includes a piezoelectric or electrostrictive ceramic disk with conductive electrodes bonded to its major surfaces. A pair of metal end caps include rims that are bonded to ceramic conductive electrodes, respectively. Each end cap is comprised of a solid metal disk having a cavity formed in one surface.

If the ceramic disk is a piezoelectric material, it is poled, during manufacture, across its thickness dimension. If it exhibits an electrostrictive effect or a field-induced antiferroelectric-to-ferroelectric transformation, then it need not be poled. When a potential is applied across the electrodes, the ceramic disk expands in the thickness dimension. At the same time, the ceramic disk contracts in the x and y dimensions causing the end caps to bow outwardly, amplifying the actuation distance created by the contraction of the ceramic disk.

To improve the displacements achievable through actuation of the ceramic disk, an inventor hereof (in U.S. Pat. No. 5,729,077) utilized sheet metal caps (convex outward) joined to opposed planar surfaces of the ceramic substrate. In a sensor embodiment, the sheet metal caps were subjected to a displacement by an instrumentality (i.e., pressure), and a resulting change in voltage across the ceramic substrate was sensed. Due to the shape of the sheet metal caps, the transducer was dubbed a "cymbal" transducer.

Both the moonie and cymbal transducers use a piezoelectric disk (poled in the thickness direction) sandwiched between two metal end caps. The caps contain a shallow cavity on their inner surface. The presence of the cavities allows the caps to convert and amplify the small radial displacement of the disk into a much larger axial displacement normal to the surface of the caps, which contributes to a much larger acoustic pressure output than would occur in the uncapped ceramic.

The cymbal transducer shown in U.S. Pat. No. 5,729,077 is intended for shallow water use when employed as a hydrostatic sensor. If the applied hydrostatic pressure exceeds a certain threshold, the bounding metal caps will deform and collapse, destroying the pressure amplification effect. Accordingly there is need for a cymbal-type transducer that will operate at high depths, without collapsing.

SUMMARY OF THE INVENTION

An electroactive device incorporating the invention includes an electroactive ceramic annular substrate having a pair of opposed planar annular surfaces, a hollowed interior region and a thickness aspect. A first cap having a concave shape that extends into the hollowed interior region includes a rim portion, bounding the hollowed interior region, and joined to a first one of the planar surfaces. A second cap having a concave shape that extends into the hollowed interior region includes a rim portion, bounding the hollowed interior region, and joined to a second one of the planar surfaces. A potential measured across the ceramic substrate enables a field change in the ceramic substrate to be sensed, the field change caused by flexure of the ceramic substrate as a result of a pressure applied to the first and second caps.

DETAILED DESCRIPTION OF THE INVENTION

Figure 1:
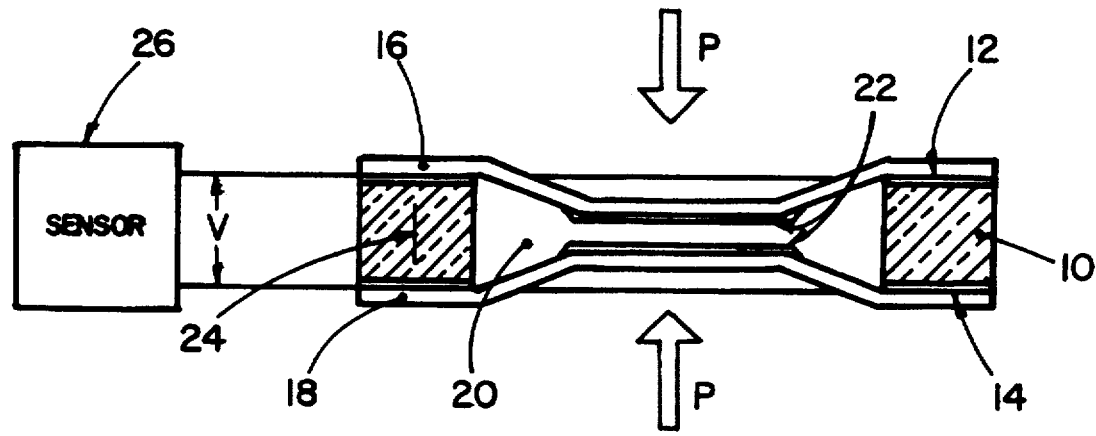
FIG. 1 is a side sectional view of a transducer embodying a first version of the invention.

Referring to FIG. 1, a first embodiment of the transducer of the invention includes a piezoelectric or electrostrictive ceramic annulus 10 with conductive electrodes bonded 12 and 14 bonded to opposed surfaces of annulus 10. A pair of formed sheet metal end caps 16 and 18 take the shape of opposed truncated cones and include rims that are bonded to respective electrodes 12 and 14. The cones are positioned such that they respectively extend into hollowed out area 20 within ceramic annulus 10. To prevent electrical contact between end caps 16 and 18, insulating layers 22 may be placed on the opposed surfaces thereof. Hereafter, the transducer configuration of FIG. 1 will be referred to as the inverted cymbal transducer to distinguish it from the standard cymbal transducer shown in U.S. Pat. No. 5,729,077.

Each end cap is preferably produced by a stamping process wherein a metal sheet is both cut and shaped to a "cymbal" form in a stamping action. The metal sheet preferably exhibits a relatively constant thickness dimension that is thin in relation to the overall surface area of the end cap structure. The thickness of the metal sheet is dependent upon the actuation pressure required and will, as a result, be thicker when higher actuation pressures are needed.

Ceramic annulus 10 is preferably poled across its thickness dimension (i.e., along the direction shown by arrow 24). It is to be understood however, that ceramic annulus 10 can be poled in a radial direction. A sensor 26 is coupled to conductive electrodes 12 and 14 and is adapted to measure a voltage thereacross that enables pressure-induced changes in polarization to be sensed.

If the transducer of FIG. 1 is subjected to a pressure wave P, end caps 16 and 18 are caused to move towards each other and as a result create radially inward-directed stresses on ceramic annulus 10, causing compressive forces thereon. The arrangement of end caps 16 and 18 enables them to withstand substantially higher pressures than the arrangement of the cymbal transducer of U.S. Pat. No. 5,729,077 (which operates by having radially-outward stresses induced into the ceramic substrate). The compression of ceramic annulus 10 causes a reorientation of the polarization dipoles that is sensed by resulting changes induced in the voltage applied by sensor 26.

Figure 2:
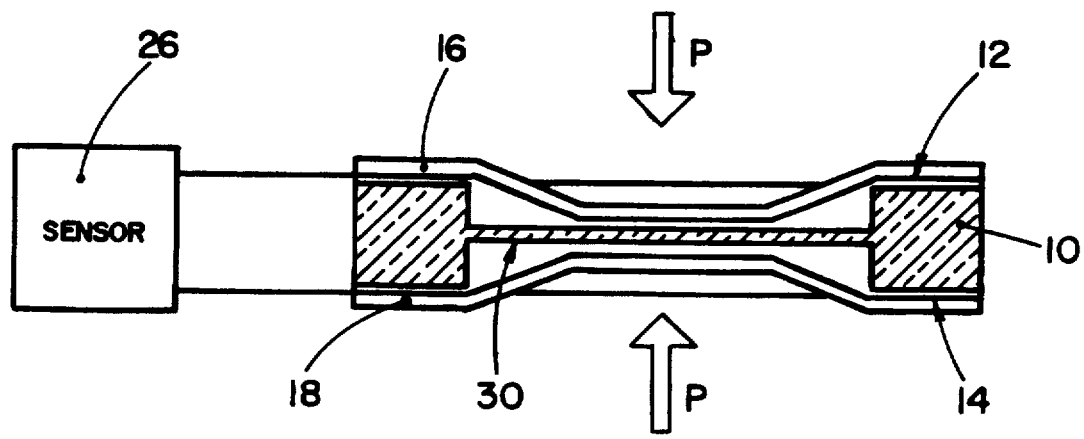
FIG. 2 is a side sectional view of a transducer embodying a second version of the invention.

While not as preferred as the first embodiment, a second embodiment of the invention is shown in FIG. 2, wherein a thin region 30 of ceramic has been left within ceramic annulus 10. Region 30 prevents the cymbal end caps 16 and 18 from touching each other under extreme pressure conditions. Further, it provides additional stability for ceramic annulus 10 under such conditions.

While many ceramics, as diskussed below, are appropriate for application to the cymbal actuator, it is preferred that the ceramic material exhibit high $d_{31}$ and $d_{32}$ coefficients so as to enable, for a given applied force, the greatest available voltage alterations to be experienced.

Piezoelectric transducer materials that are used with the structures shown and described above are based primarily on the lead zirconate titanate (PZT) family including PLZT ((Pb,La) (Zr,Ti) $O_3$). Also PVDF and its copolymer may be used. Electrostrictive ceramic disks utilize lead magnesium niobate (PMN)-based ceramics. Lead titanate-modified PMN (PMN-PT) is preferred. $Pb(Sn,Zr,Ti)O_3$ ceramics exhibiting antiferroelectric-to-ferroelectric transitions with applied field may also be used.

Experimental Procedure
A. Fabrication

Cymbal-type end caps are produced with a dimension depending on application. Preferred materials for endcaps 16 and 18 are dependent on application and can be chosen from metal, polymer, polymer-based composites and glass-based materials. If low level pressure changes are to be sensed, aluminum or copper-based metals may be used. If high pressures are to be encountered, a stiffer metal such as tungsten is preferred. Other metals for end caps 16 and 18 can be brass, bronze, kovar, zirconium, etc.

If end caps 16 and 18 are comprised of metal, to prevent shorting thereof under high pressure conditions, the inner surfaces of the end caps may be coated with an insulating layer 22 (e.g., a polymer).

Epoxy is used to bond the inverted end caps to a piezoelectric or electrostrictive ring 10, which has the same outer diameter as the end caps.

Single transducer elements can be mounted into a multielement planar or conformal array to further improve the performance. They are connected electrically in parallel in the array.

EXAMPLE 1

Brass caps were punched from a metal foil of 0.25 mm thickness and shaped using a special die. The shaped caps had a diameter of 12.7 mm. The cavity diameter was 9.0 mm at the bottom and 3.2 mm at the top. The cavity depth was 0.2 mm. The caps were then bonded to a piezoelectric ceramic ring (PKI 552, Piezokinetics Inc., Bellefonte, Pa.) having a thickness of 1 mm, outer diameter of 12.7 mm, and inner diameter of 9.0 mm. The PZT rings were poled in the thickness direction. The bonding material was an Emerson and Cuming insulating epoxy. A ratio of three parts 45 LV epoxy resin to one part 15LV hardener was used. The thickness of the epoxy bonding layer was approximately 20 mm. The entire assembly was kept under uniaxial stress in a special die for 24 hours at room temperature to allow the epoxy time to cure.

EXAMPLE 2

Single element inverted cymbal transducers were incorporated into a 9-element square planar array. The nine transducers were sandwiched between two copper-clad PC boards each 1.5 mm thick. Holes 11 mm in diameter were drilled equidistant from one another through the boards. Each element had a center-to-center spacing of 13.5 mm. Plastic posts 1.5 mm thick were used to maintain a uniform distance between the upper and lower panels, which were screwed together tightly to keep the transducers in place. The elements were electrically in parallel because of the PC board. After assembly, the array had a dimension of 5.5 cm×5.5 cm and a thickness of 0.4 cm. Its weight was about 30 g.

Underwater calibration tests of single inverted cymbals and arrays were performed at the Applied Research Laboratory at Penn State University. The tank measured 5.5 m in depth, 5.3 m in width and 7.9 m in length. A pure tone sinusoidal pulse signal of 2 msec duration was applied to the test transducer and its acoustic output was monitored with a standard F33 hydrophone. The test transducer and the standard were positioned at a depth of 2.74 m and separated by a distance of 3.16 m. The parameters measured for these underwater devices were resonance frequency, mechanical Q, Transmitting Voltage Response (TVR), Free-Field Voltage Sensitivity (FFVS), and beam pattern.

B. Finite Element Analysis

The Finite Element Analysis code ATILA was used in the evaluation and in further improvement of the inverted cymbal transducer designs. ATILA was developed at the Acoustics Department at Institut Superieur d'Electronique du Nord (ISEN) to model underwater transducers. A static analysis was performed to provide information concerning pre-stresses and the transducer's response under hydrostatic pressure. Modal analysis was carried out to determine the vibration modes, their resonance and antiresonance frequencies, and associated coupling factors.

Through harmonic analysis, the in-air and in-water impedance and displacement field can be computed as a function of frequency, together with the Transmitting Voltage Response, Free Field Voltage Sensitivity and the directivity patterns. ATILA was used to estimate the TVR and FFVS of several cymbal transducer designs.

Results and Diskussion

It has previously been shown for non-inverted cymbal transducers that the flextensional resonance frequency can be tailored by changing the cap material and geometry. The inverted cymbal utilizes the same amplification mechanism as the standard cymbal, but its flextensional resonance frequency is slightly lower than its standard counterpart as is shown in Table 1 below, and it is also easily tailored. Other in-air characteristics of inverted cymbal transducers are also shown and compared with standard cymbal transducers in Table 1. The effective $d_{33}$ and capacitance of inverted cymbal transducers are smaller than those of standard cymbal transducers due to less piezoelectric material used in the device.

TABLE 1

Typical in-air characteristics of standard and inverted cymbal transducers

| | standard cymbal | inverted cymbal |
| --- | --- | --- |
| flextensional frequency | 24 kHz | 23 kHz |
| coupling coefficient | 20% | 15% |
| effective $d_{33}$ | 12000 pC/N | 4900 pC/N |
| capacitance | 2.9 nF | 1.2 nF |

Figure 3:
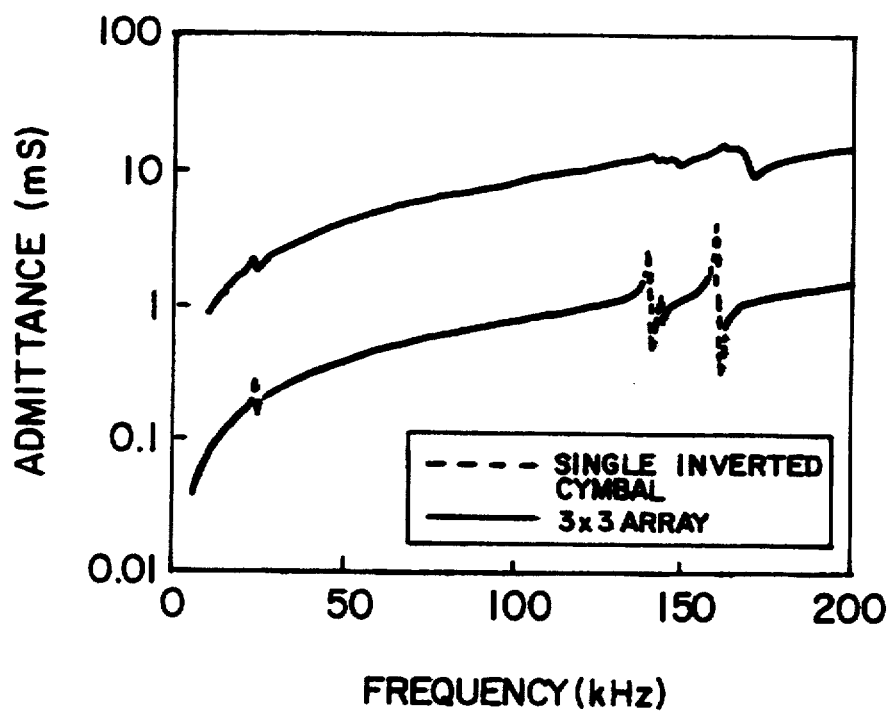
FIG. 3 is a plot of admittance spectrum of a single transducer in accord with the invention and a nine element array.

FIG. 3 shows a representative admittance spectrum of an inverted cymbal transducer. The first peak, at 22 kHz, is associated with the flextensional mode of the composite transducer. However, for illustrative purposes without limiting this invention, a frequency range of 1 kHz to 100 kHz can be obtained for PZT5 based rings with outer radius from one inch to a quarter inch. The higher resonance peaks come from the coupling between the radial mode of the ceramic ring and high order flextensional modes.

FIG. 3 also shows the admittance spectrum of a nine-element inverted cymbal array. Its resonance is damped and broadened due to element interactions and the fact that the individual elements have slightly different frequencies.

Figure 4:
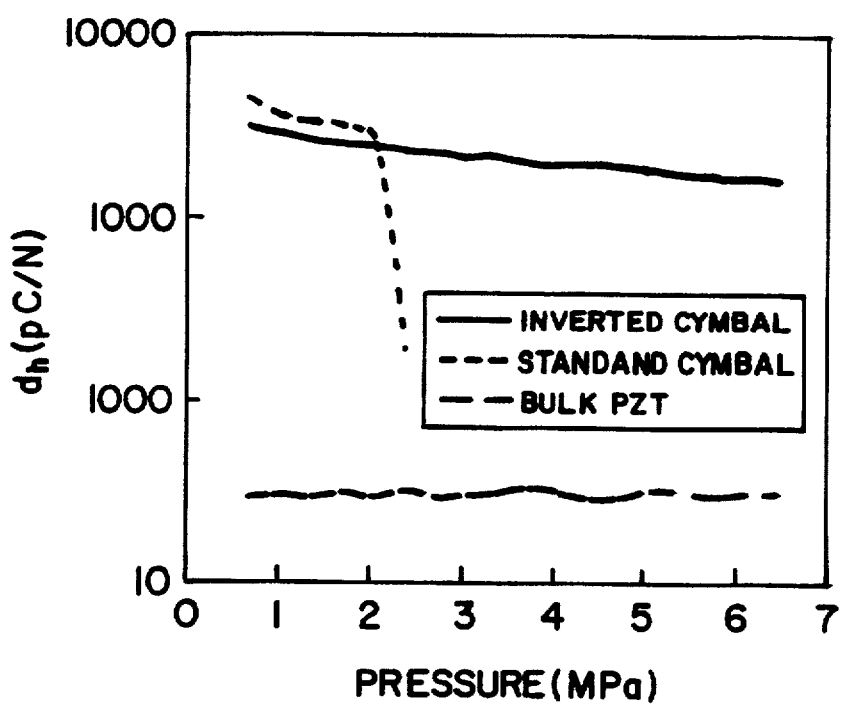
FIG. 4 is a plot of pressure dependence of the effective $d_h$ coefficients for both the prior art cymbal transducer and the transducer of the invention.

FIG. 4 shows the pressure dependence of the effective $d_h$ of an inverted cymbal transducer and standard cymbal transducers. Effective $d_h$ for bulk PZT as a function of pressure is also shown and compared. Both standard and inverted cymbal transducers have effective $d_h$ values over fifty times larger than that of bulk piezoelectric material. The standard cymbal transducer can withstand 2 MPa, but when the pressure increases over 2 MPa, it fails catastrophically due to the permanent deformation of the end caps.

In the case of the inverted cymbal transducer, it has a slightly lower $d_h$ than the standard cymbal transducer but it survives up to 6 MPa without significant degradation in its properties. It is anticipated that this design may withstand much greater pressures, depending upon the materials and dimensions used. The inverted cymbal exhibits much improved pressure tolerance under hydrostatic loading. Under some higher pressures, the inverted cymbal may fail due to a shorting of the two end caps, but such can be avoided by applying a thin insulating layer between the end caps.

Figure 5A:
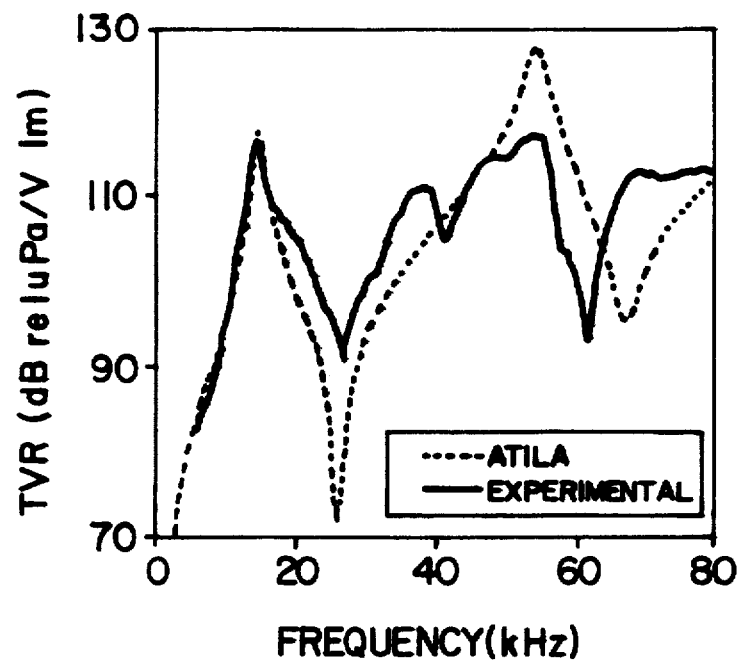
FIG. 5a is a plot of measured and calculated Transmitting Voltage Response (TVR) for a transducer incorporating the invention hereof.
Figure 5B:
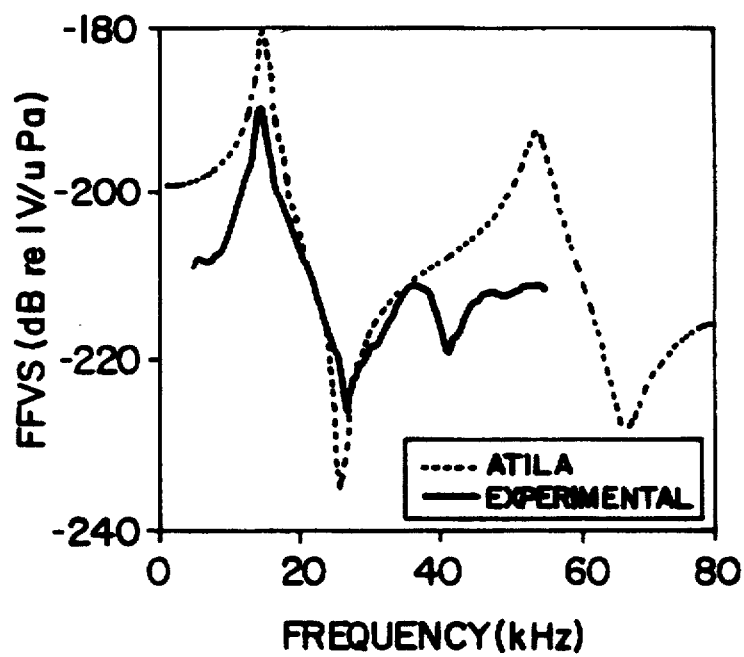
FIG. 5b is a plot of measured and calculated Free-Field Voltage Sensitivity (FFVS) for a transducer incorporating the invention hereof.

The TVR and FFVS of a single inverted cymbal transducer are shown in FIGS. 5a and 5b. Like the standard cymbal, the inverted cymbal shows narrow band characteristics with a mechanical Q around 9. The TVR and FFVS calculated with the ATILA code are also shown for comparison with the experimental results. Fairly good agreement is obtained indicating that ATILA adequately models the cymbal behavior in water. The small diskrepancies between the calculated and the experimental results may arise from imperfections in the ring, from stresses in the metal end caps, or from the fact the contribution of the epoxy bonding layer and the fixtures used to hold the sample were not taken into account in modeling.

Figure 6A:
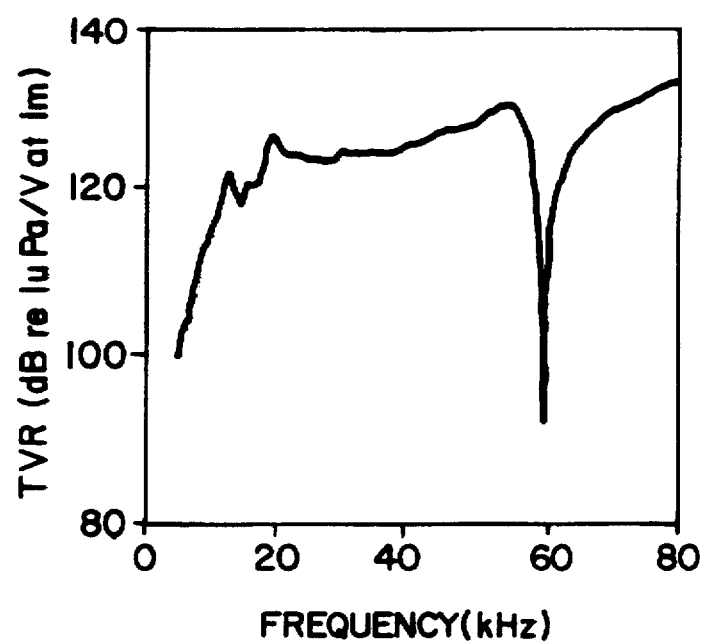
FIG. 6a is a plot of measured and calculated TVR for a nine element array of transducers incorporating the invention hereof.
Figure 6B:
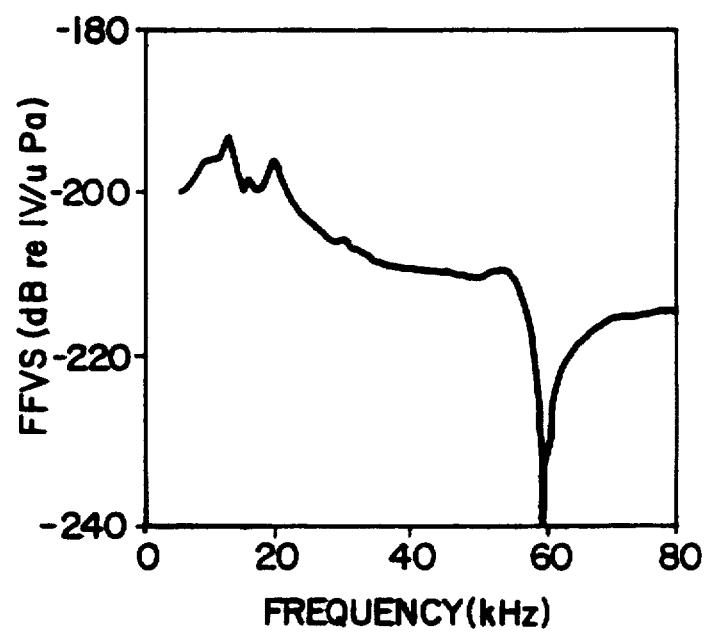
FIG. 6b is a plot of measured and calculated FFVS for a nine element array of transducers incorporating the invention hereof.

Individual inverted cymbals may not be powerful enough, nor sufficiently broadband for a desired use. It may thus be necessary to incorporate a plurality of transducers into arrays to improve underwater performance. The TVR and FFVS of a nine-element array of inverted cymbal transducers are illustrated in FIG. 6a and 6b. The array shows broader band characteristics in both TVR and FFVS. It has a TVR of around 125 dB re 1 mPa/V @ 1 m and is rather flat over the frequency range from 20–50 kHz. Its FFVS is not as flat as the TVR, but a wider bandwidth can be obtained by incorporating more cymbal transducers into the array and by precisely controlling and arranging the resonance frequencies and position of the array transducers.

Inverted cymbal transducers demonstrate a much improved pressure tolerance over standard cymbals (i.e., as shown in U.S. Pat. No. 5,729,077) and can go much deeper underwater, extending the range of operation for cymbal transducers. The simple fabrication process makes it easy to mass-produce these transducers and greatly reduces their cost. Their thin profile, light weight and low cost makes it possible to assemble a very large array of inverted cymbal transducers, either in a planar or conformal array. It is expected that the array can be further optimized to work as well as a standard Tonpilz array when a high source level is bit required.

The inverted cymbal transducer may be a good transducer for conformal arrays where drastically reducing the vehicle's weight and cost is important. Hard, PZT4, instead of soft, PZT5, piezoelectric drive elements can be used to achieve a high source level.

The low-cost inverted cymbal array can also be used as a receiver for acoustic imaging. The most useful frequency range for underwater imaging appears to be the 5–50 kHz band where the inverted cymbal transducer excels. When fully optimized, an array of inverted cymbal hydrophones may serve as a multi-element receiver capable of functioning as an acoustic camera. Phased arrays of a thousand or more hydrophones are feasible using these small low-cost, mass-produced components with high hydrostatic piezoelectric coefficients. The improved pressure performance allows the inverted cymbal transducer array to work both in shallow water and in deep submergence.

To obtain the desired directivity and impedance match, the transducers are mounted in arrays. The single transducers in an array are connected electrically using fine electrical wires. They can be connected in parallel or serially, or individually for beamforming or velocity control. Conductive epoxy is preferably used to bond the wires to the flanges of the transducers. The skeleton of transducers, along with their electrical connections can be pre-bent to a desired geometry, either spherical, cylindrical etc., and then potted in polymer.

After electrical connection, the assembled transducers are potted in polyurethane or another polymer. The introduction of the polymer coating, along with the thin profile and small size of the transducers, makes it possible to build flexible arrays. The arrays can be linear, planar, or curved, depending on the applications.

In summary, the inverted cymbal transducer has a much higher pressure tolerance than the standard cymbal transducer. Its thin profile and small size make it easy to mount in a planar or curved array. When incorporated into a planar nine-element array, it shows medium output power and broad band characteristics combined with a small radiating area and light weight, making it a promising candidate as an underwater sound projector and receiver.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. An electroactive device comprising:

an electroactive ceramic annular substrate having a pair of opposed planar annular surfaces, a hollowed interior region and a thickness aspect;

electrodes coupled to said ceramic annular substrate;

a first cap having a concave shape that extends into said hollowed interior region and a rim portion bounding said hollowed interior region and joined to a first one of said planar surfaces;

a second cap having a concave shape that extends into said hollowed interior region and a rim portion bounding said hollowed interior region and joined to a second one of said planar surfaces; and means for measuring a potential developed on said conductive electrodes to enable a field change in said ceramic substrate to be sensed, said field change caused by flexure of said ceramic substrate as a result of a pressure applied to said first and second metal caps.

2. The device of claim 1, wherein each said first cap and second cap are of formed sheet metal stampings.

3. The device of claim 1, wherein each said first cap and second cap are formed of a polymeric material.

4. The device of claim 1, wherein each said first cap and second cap exhibit a truncated conical shape.

5. The device of claim 1, wherein said electroactive ceramic substrate is poled across said thickness aspect and exhibits a piezoelectric characteristic.

6. The device of claim 1, wherein said electroactive ceramic substrate means exhibits an electrostrictive characteristic.

7. The device of claim 1, wherein said electroactive ceramic substrate means exhibits antiferroelectric and ferroelectric switching characteristics.

8. The device of claim 1, wherein said hollowed interior region extends entirely through said thickness aspect.

9. The device of claim 1, wherein said hollowed interior region comprises two regions separated by a reduced thickness portion of said ceramic annular substrate.

10. A plurality of devices as recited in claim 1, further comprising:

conductors connecting said devices into an array.

* * * * *

UNITED STATES PATENT AND TRADEMARK OFFICE
Certificate

Patent No. 6,232,702 B1　　　　　　　　　　　　　　　　　　　　　　　Patented: May 15, 2001

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Robert E. Newnham, State College, PA; Jindong Zhang, State College, PA; Richard Joseph Meyer, Jr., State College, PA; and William Jack Hughes, Boalsburg, PA.

Signed and Sealed this Twenty-eighth Day of June 2005.

DARREN SCHUBERG
*Supervisory Patent Examiner*
Art Unit 2835